(12) United States Patent
Giuliani et al.

(10) Patent No.: US 11,818,284 B2
(45) Date of Patent: Nov. 14, 2023

(54) PERSONAL SHIELDING DEVICE

(71) Applicant: Tiziana Vigni, San Gimignano (IT)

(72) Inventors: Livio Giuliani, Rome (IT); Tiziana Vigni, San Gimignano (IT)

(73) Assignee: Tiziana VIGNI, San Gimignano (IT)

( * ) Notice: Subject to any disclaimer, the term of this patent is extended or adjusted under 35 U.S.C. 154(b) by 481 days.

(21) Appl. No.: 17/261,301

(22) PCT Filed: Jul. 16, 2019

(86) PCT No.: PCT/IB2019/056059
§ 371 (c)(1),
(2) Date: Jan. 19, 2021

(87) PCT Pub. No.: WO2020/016773
PCT Pub. Date: Jan. 23, 2020

(65) Prior Publication Data
US 2021/0266388 A1 Aug. 26, 2021

(30) Foreign Application Priority Data

Jul. 19, 2018 (IT) .................... 102018000007357

(51) Int. Cl.
| | |
|---|---|
| *H04B 1/3827* | (2015.01) |
| *H05K 9/00* | (2006.01) |
| *H04M 1/02* | (2006.01) |
| *G02B 1/14* | (2015.01) |
| *B32B 17/10* | (2006.01) |
| *H04M 1/18* | (2006.01) |

(52) U.S. Cl.
CPC ..... *H04M 1/0266* (2013.01); *B32B 17/10005* (2021.01); *B32B 17/10174* (2013.01); *G02B 1/14* (2015.01); *H04B 1/3838* (2013.01); *H04M 1/185* (2013.01); *H05K 9/0094* (2013.01)

(58) Field of Classification Search
CPC ... H04B 1/3838; H04B 1/3888; H05K 9/0094
See application file for complete search history.

(56) References Cited

U.S. PATENT DOCUMENTS

| | | | |
|---|---|---|---|
| 2013/0199950 A1* | 8/2013 | Feller ......................... | C09J 7/20 156/247 |
| 2014/0159839 A1* | 6/2014 | Kim ...................... | H01H 36/00 335/219 |
| 2014/0262474 A1* | 9/2014 | Koeppel ................... | A45F 5/02 174/376 |
| 2014/0332417 A1* | 11/2014 | Wicks ................... | H04M 1/185 206/37 |

(Continued)

FOREIGN PATENT DOCUMENTS

WO 2013052024 A1 4/2013

OTHER PUBLICATIONS

International Search Report for International Patent Application No. PCT/IB2019/056059, dated Aug. 20, 2019, 2 pages.

*Primary Examiner* — Hung V Ngo
(74) *Attorney, Agent, or Firm* — Workman Nydegger

(57) ABSTRACT

A personal shielding device applicable to a screen, in particular a touch screen of an electronic device, has a continuous absorbent sheet at least partially made of metal material. The continuous absorbent sheet is adapted to absorb electromagnetic waves emitted by the electronic device in direction of a user.

11 Claims, 3 Drawing Sheets

(56) References Cited

U.S. PATENT DOCUMENTS

| | | | |
|---|---|---|---|
| 2015/0105128 A1* | 4/2015 | Huang | G06F 3/0444 |
| | | | 455/575.8 |
| 2017/0170861 A1* | 6/2017 | McAphee | G06F 1/1626 |
| 2017/0187856 A1* | 6/2017 | Kim | H04B 1/3888 |
| 2020/0328770 A1* | 10/2020 | She | H04M 1/185 |
| 2023/0155621 A1* | 5/2023 | Koeppel | H04W 52/283 |
| | | | 455/522 |

\* cited by examiner

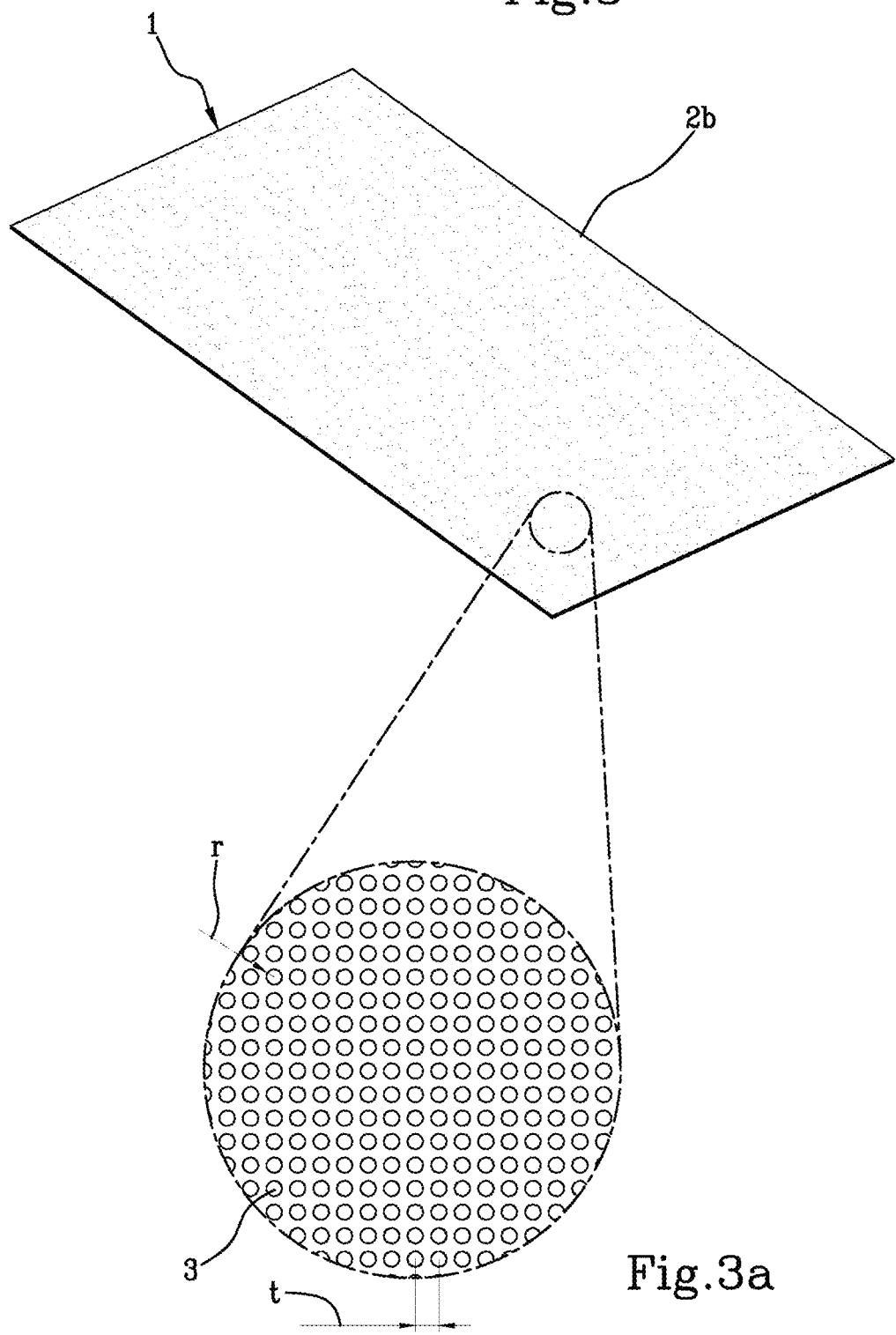

PERSONAL SHIELDING DEVICE

CROSS-REFERENCE TO RELATED APPLICATIONS

This application is a National Phase Application of PCT International Application No. PCT/IB2019/056059, having an International Filing Date of Jul. 16, 2019, which claims the benefit of priority to Italian Application No. 102018000007357, filed Jul. 19, 2018, each of which is hereby incorporated by reference in its entirety.

FIELD OF THE INVENTION

The present invention relates to the technical sector of protection devices against non-ionising radiation.

In particular, the present invention relates to a personal shielding device applicable to electronic devices, for example mobile phones.

The term "personal" intends to define a device that can be applied in all situations in which it is necessary to partially protect a user, or a part of the body, from the electromagnetic radiation emitted by a personal and/or portable device.

SUMMARY OF THE INVENTION

In this technological sector there are protection means intended for the protection of objects, which provide total and full shielding, such as metal cases for credit cards, which have an important function in preventing codes being picked up by electromagnetic equipment placed nearby.

However, it is clear that such a solution is not applicable to electronic devices, such as mobile phones, which base their utility and operation on the transmission and reception of data.

In fact, it is not possible to apply a full shield to such devices, as this solution would actually make the device unusable: shielding it means that in transmission the mobile phone would have to use all the available power, even exceeding the operating limit, while the reception would be reduced to the same extent as the protection cuts off the signal (typically, for a fine metal grille, a loss of about 2-6 dBm).

It follows that there are currently no personal protection means or systems that provide at least partial protection for the user against the microwaves generated by a mobile phone or the electromagnetic waves generated by another consumer electronic device.

The main problem that arises in the attempt to provide a protection for the user from the use of the mobile phone, but in principle valid for all consumer devices that generate high frequency electromagnetic fields, starting from computers, is that a protection is more efficient the more effectively it reduces the performance of the device itself, to the point that it prevents the operation thereof.

An example of this is the already mentioned container for credit cards, readily available on the market which, when wrapped around the card, prevents the access thereof to electronic spies, which may be able to perform the cloning thereof.

Obviously, it would be possible to place a mobile phone in a metal case, to protect the holder from its electromagnetic fields, but this full shielding would make the correct operation of the device impossible.

It is also necessary to consider the fact that current mobile phones have touch screens and a protection must necessarily maintain both the visibility and the deformability thereof under pressure and temperature in order to be able to guarantee correct operation.

The same theory outlined above is also applicable in reference to other electronic devices for personal use such as, for example, tablets and computers.

It has to be further considered the crucial importance of shielding the user from the effect of the induction zone generated by the near field radiation of the device.

As a matter of fact, the near field radiation is the one believed to cause the insurgence of cancer in particular in the torso and head region of the body, as supported by the IARC communication of 2011, which can be found at the following link: https://www.iarc.fr/wp-content/uploads/2018/07/pr208_E.pdf
and by the Toxicology Program Meeting of 2017: https://nlp.niehs.nhs.gov/results/areas/cellphones/index.html#studies
and in the final report: https://microwavenews.com/news-center/ntp-final-rf-report In this context, the technical task underlying the present invention is to provide a personal shielding device which obviates at least some of the drawbacks in the prior art as described above.

In particular, it is an object of the present invention to provide a personal shielding device able to provide the user with optimal protection from the non-ionising radiation emitted by the electronic equipment to which the shielding device is applied, guaranteeing at the same time the correct operation of the equipment itself.

More in particular, it is an object of the present invention to provide a personal shielding device able to shield the user from the effect of the induction zone generated by the near field radiation of the electronic device.

SUMMARY OF THE INVENTION

The technical task set and the objects specified are substantially attained by a personal shielding device, comprising the technical characteristics as set out in one or more of the accompanying claims.

According to the present invention a personal shielding device is shown, applicable to a screen, in particular a touch screen, of an electronic device, which comprises an absorbent sheet made at least partially with a metal material.

The absorbent sheet is adapted to absorb the electromagnetic waves emitted by the electronic device in the direction of the user.

The dependent claims herein incorporated for reference, correspond to different embodiments of the invention.

The disclosed invention achieves at least the following technical effects:
  optimal protection from the non-ionising radiation emitted by the electronic equipment to which the shielding device of the invention is applied;
  a shielding for the user from the effect of the induction zone generated by the near field radiation of the electronic device, thereby reducing insurgence of cancer in particular in the torso and head region of the body.

BRIEF DESCRIPTION OF THE DRAWINGS

Further features and advantages of the present invention will become clearer from the indicative and thus non-limiting description of a preferred but non-exclusive embodiment of a personal shielding device, as illustrated in the attached drawings, in which:

FIG. 3 shows a particular embodiment of the present invention;

FIG. 3a shows a detail of FIG. 3;

DETAILED DESCRIPTION

Figure 1:
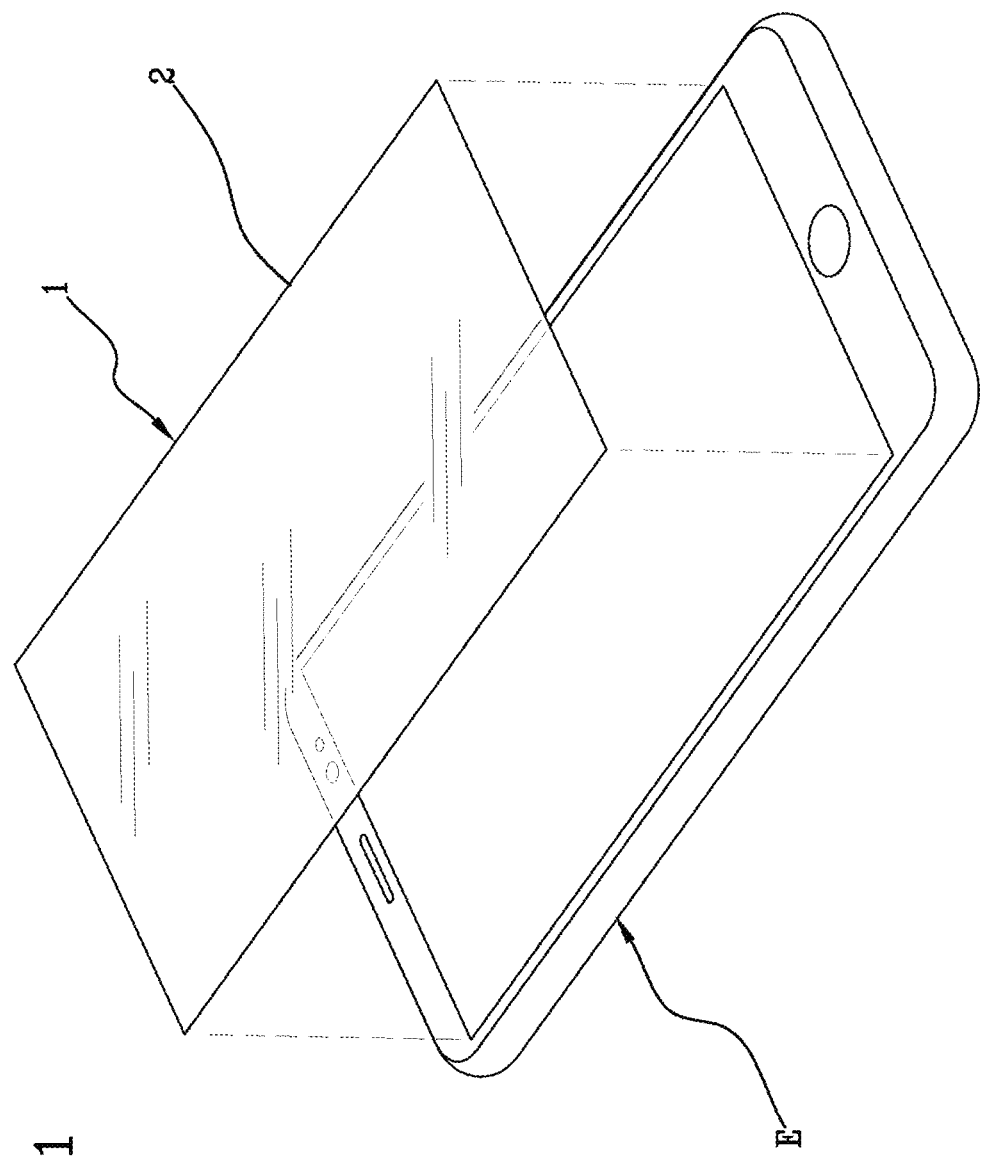
FIG. 1 shows a personal shielding device applied in particular to a mobile phone.
Figure 2:
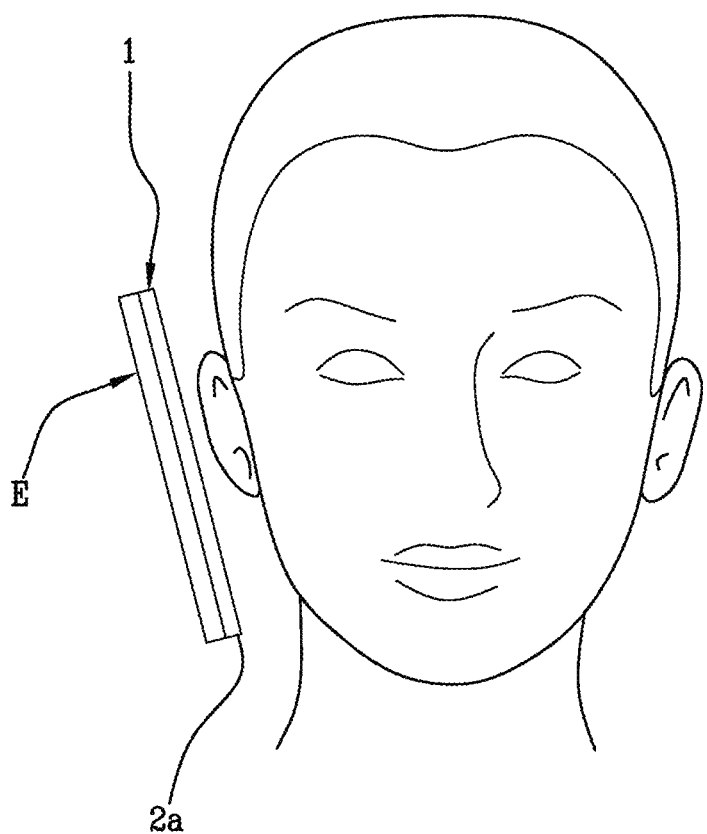
FIG. 2 shows the positioning of the shielding device of FIG. 1 during the use of the electronic device.
Figure 4:
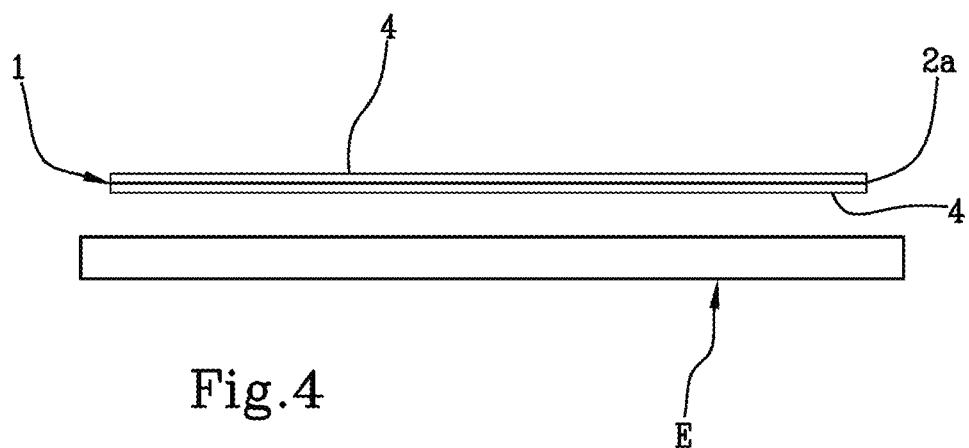
FIG. 4 shows a sectional view of the shielding device in the step of application to an electronic device.

In FIG. 1 the reference number 1 generally indicates the personal shielding device according to the present invention.

The personal device 1 is applicable to a face of an electronic device "E" which may be, by way of non-limiting example, a mobile phone, especially a smartphone, a tablet, a computer or any electronic device susceptible to emitting non-ionising radiation in the direction of a user.

In particular, the personal device 1 is applicable to a screen, preferably a touch screen, of the electronic device; in the following description explicit reference will be made to the screen of a mobile phone, without thereby precluding the applicability of the personal device 1 in the further contexts outlined above.

The personal device 1 comprises an absorbent sheet 2 made at least partially with a metal material and configured to absorb the electromagnetic waves emitted by the electronic device "E" in the direction of the user without interfering with those emitted in the opposite direction by its transceiver components.

In this way it is possible to simultaneously guarantee the correct operation of the electronic device "E" and the protection of the user from electromagnetic radiation, in particular in the wavelengths of microwaves, emitted therefrom.

Specifically, thanks to its electromagnetic characteristics, the absorbent sheet 2 constitutes the ideal shield of a field in propagation, while maintaining at the same time the properties of transparency to light and transmissibility of pressure and conduction of heat necessary for the user's interaction with the screen of the electronic device "E".

According to a possible embodiment, the absorbent sheet 2 is made through a continuous sheet 2a and the metal material is a metallic glass material.

The term metallic glass means a metal solid, usually an alloy, with an amorphous atomic, therefore not crystalline, structure.

In particular, according to such embodiment, the metallic glass comprises a ternary metallic glass alloy based on iron or nickel added to boron in vitreous form and then added to yttrium, for example according to formula $$Y_4Fe_{75}B_{21}.$$

The alloy identified above is characterised by coercivity of about 40 A/m and specific electrical conductivity greater than 1/90. In accordance with possible alternative forms, yttrium can be substituted with an element that has an atomic size which is not less than 130% of the size of iron and whose percentage in the alloy is not less than 3% or greater than 10%.

The percentage of boron can also vary, between 18% and 27%.

As indicated above, iron may be substituted at least partially by nickel or, according to possible alternatives that will be discussed in more detail below, also by structures comprising palladium and/or zirconium in order to make the protective sheet 2 with metallic glass material.

In general terms, the protective sheet 2 is made according to the parametric formula:

$$Y_{3+a}Fe_{79-a-b-c}Ni_bB_{18+c}$$

wherein the indicated parameters can assume the following values:

a is comprised between 0 and 3 in atomic percent;

b is equal to 0 or 67 in atomic percent;

c is comprised between 0 and 9 in atomic percent. If a=3, b=67, c=9 iron can be completely substituted in the alloy by nickel.

A higher percentage of boron makes the alloy more vitreous while a higher percentage of yttrium compensates for the higher molecular weight of the alloy due to the substitution of nickel with respect to iron.

The specific conductivity of the alloy parameterised above guarantees the Faraday protection effect from the electromagnetic field.

However, prolonged use of the personal device 1 over time still leads to a loss of magnetisation thereof, which reduces the absorption efficiency of the electromagnetic waves.

In order to restore correct operation, the personal device has an electrical contact area in proximity to the absorbent sheet 2, which allows the electrical connection thereof with a charging device.

By way of example, it is reported that the average exposure to the power density of the screen of a mobile phone is typically less than 10 mW/m$^2$ in effective value.

The coercivity of 40 A/m guarantees the correct operation of the personal device 1 for a time of over 2 hours, i.e. a time which is more than twice than that identified as reference for defining heavy users of a mobile phone.

The charging device comprises a rechargeable battery, preferably a high performance one (10,000 mAh), and an appropriate transformer placed in series with the battery.

The recharging of the electromagnetic shielding properties of the personal device can advantageously be performed in parallel with the recharging of the battery of the electronic device "E".

To guarantee the maintenance of good visibility of the underlying screen and where envisaged the correct operation of its touch functions, the absorbent sheet 2 has a thickness comprised between 0.2 mm and 0.3 mm.

In accordance with a further possible embodiment, the absorbent sheet 2 is a perforated sheet 2b and, preferably, the metal material comprises aluminium.

In particular, the perforated sheet 2b has a plurality of substantially circular holes 3 the dimensions and positioning of which on the perforated sheet 2b can be defined as a function of the particular application field in which the use of the personal device 1 is prefigured.

In fact, in this case, the efficiency of the personal device 1 in blocking the radiations at certain frequencies will depend on the geometry of the holes 3 made in the perforated sheet 2b, which must therefore be appropriately sized.

In more detail, the radius "r" of each hole 3 is determined according to the formula:

$$r = c/(20*v);$$

wherein the parameter c is the speed of light (equal to about 3*10$^8$ m/s) and the parameter v is a frequency value greater than or equal to the rated operating frequency of the electronic device.

In other words, a value of v is selected that is greater than that of the highest frequency at which the electronic device "E" can receive and transmit.

In the same way, the relative distance "t" between the respective centres of adjacent holes 3 is calculated according to the formula:

$$t=3*r;$$

In the particular case in which the personal device 1 is configured to be applied to a mobile phone, the reference term for determining the value of the parameter v comes from the central frequency of the operating telephone frequency band.

Therefore, in the particular case in which a telephone operating with 4G standard is considered, it is possible to select a value of v=2.35 GHz, greater than the central frequency of the 4G standard which is defined up to 2600 MHz, and using the formulas set out above it is possible to determine for the holes 3 a diameter value equal to 1.33 mm and a relative distance of the centres of adjacent holes 3 equal to 2 mm.

To guarantee the maintenance of good visibility of the underlying screen and where envisaged the correct operation of its touch functions, the absorbent sheet 2 has a thickness comprised between 0.15 mm and 0.25 mm, preferably equal to 0.17 mm.

To guarantee resistance to any impacts and scratches, the personal device 1 comprises a protective coating 4 applied to at least one face of the absorbent sheet 2, in particular at least to the face arranged towards the user during the use of the electronic device "E".

It therefore follows that the absorbent sheet 2, once the personal device 1 is applied, is contained between the screen of the electronic device "E" (therefore between any tempered glass surface that is usually arranged to protect such screen) and the protective coating 4.

Such protective coating 4 can also be applied on each face of the absorbent sheet 2, thus realising a structure that contains the absorbent sheet 2 inside it.

In accordance with a possible embodiment, such protective coating 4 comprises at least one tempered glass sheet.

In particular, the tempered glass sheet has a thickness comprised between 0.1 mm and 0.2 mm.

Alternatively, the at least one protective coating 4 can be realised through a protective sheet made of a metallic glass material, preferably comprising palladium.

Such protective sheet allows the resistance and hardness of the device to be improved, also increasing the electromagnetic insulation thanks to the diamagnetic properties of palladium alloys.

In particular, the protective sheet is made of a metallic glass material according to the following parametric formula:

$$Pd_{40+a}Cu_bNi_{40-a-b}Si_cP_{20-c}$$

wherein the indicated parameters can assume the following values:
a is comprised between 0 and 2.5 in atomic percent;
b is equal to 0 or 30 in atomic percent;
c is comprised between 0 and 4 in atomic percent;
at least one from among b and c is equal to 0.

In particular, the last parametric condition indicated guarantees that the alloy used for making the protective sheet is a quaternary alloy.

In accordance with a possible alternative embodiment, the protective sheet is made of a metal alloy that uses zirconium instead of palladium.

In accordance with a particular aspect of the present invention, the protective sheet and the absorbent sheet 2 are made as a single piece.

This means that it is possible to realise an absorbent sheet 2 in accordance with the embodiments already set out and to protect it through the superposition of a protective metallic glass sheet containing palladium or zirconium, or directly realise the absorbent sheet 2, which coincides in this case with the protective sheet, using a metallic glass alloy that contains palladium or zirconium, i.e. according to the parametric formula presented above.

In accordance with a further possible embodiment the protective coating comprises a coating made of a vitrifying enamel that advantageously allows the user to be protected from any electrical discharge.

Advantageously, the present invention reaches the proposed aims overcoming the drawbacks of the prior art by providing the user with a personal shielding device that guarantees the correct operation in optimal conditions of the electronic device "E" to which it is applied, at the same time allowing the user's exposure to potentially harmful radiation to be substantially reduced.

Moreover, the device according to the present invention allows to shield the user from the effect of the induction zone generated by the near field radiation of the electronic device, thus reducing insurgence of cancer in particular in the torso and head region of the body.

What is claimed is:

1. A personal shielding device applicable to a touch screen of an electronic device orientable in use towards a user, said personal shielding device comprising a continuous absorbent sheet at least partially made of metallic glass material and adapted to absorb electromagnetic waves emitted by the electronic device in a direction of the user; said metallic glass material comprising a metal alloy of boron, yttrium, and at least one metal element selected from the group consisting of iron, nickel, palladium, and zirconium, wherein the percentage by weight of boron is comprised between 18% and 27%, and wherein the percentage by weight of yttrium is comprised between 3% and 10%.

2. The personal shielding device of claim 1, wherein the continuous absorbent sheet is made according to the following parametric formula:

$$Y_{3+a}Fe_{79-a-b-c}Ni_bB_{18+c}$$

wherein:
a is comprised between 0 and 3 in atomic percent;
b is equal to 0 or 67 in atomic percent; and
c is comprised between 0 and 9 in atomic percent.

3. The personal shielding device of claim 1, presenting an electrical contact area in proximity to the continuous absorbent sheet connectable to a charging device to restore electromagnetic shielding properties of the personal shielding device.

4. The personal shielding device of claim 1, wherein said continuous absorbent sheet has a thickness comprised between 0.2 mm and 0.3 mm.

5. The personal shielding device of claim 1, further comprising a protective coating applied to at least one face of said continuous absorbent sheet.

6. The personal shielding device of claim 5, wherein the protective coating is applied to each face of said continuous absorbent sheet.

7. The personal shielding device of claim 5, wherein said protective coating comprises at least one tempered glass sheet.

8. The personal shielding device of claim 7, wherein the at least one tempered glass sheet has a thickness comprised between 0.1 mm and 0.2 mm.

9. The personal shielding device of claim 5, wherein said protective coating comprises at least one protective sheet realized with a metallic glass material, said metallic glass material comprising $Pd_{40+a}Cu_bNi_{40-a-b}$, $Si_cP_{20-c}$, wherein:

a is comprised between 0 and 2.5 in atomic percent;

b is equal to 0 or 30 in atomic percent;

c is comprised between 0 and 4 in atomic percent; and at least one from among b and c is equal to 0.

10. The personal shielding device of claim 5, wherein said protective coating comprises at least one layer of vitrifying enamel applied to at least one face of the continuous absorbent sheet.

11. The personal shielding device of claim 1, wherein the personal shielding device has an overall thickness of less than 0.5 mm.

\* \* \* \* \*